United States Patent
Zheng et al.

(10) Patent No.: US 8,233,066 B2
(45) Date of Patent: Jul. 31, 2012

(54) IMAGE SENSOR WITH IMPROVED BLACK LEVEL CALIBRATION

(75) Inventors: Wei Zheng, Los Gatos, CA (US); Hsin-Chih Tai, San Jose, CA (US); Yin Qian, Milpitas, CA (US); Hongjun Li, San Jose, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 312 days.

(21) Appl. No.: 12/708,330

(22) Filed: Feb. 18, 2010

(65) Prior Publication Data

US 2011/0199518 A1 Aug. 18, 2011

(51) Int. Cl.
*H04N 3/14* (2006.01)
*H04N 5/225* (2011.01)

(52) U.S. Cl. .......... 348/294; 348/340; 257/432

(58) Field of Classification Search .......... 348/294, 348/243, 308, 340, E5.081
See application file for complete search history.

(56) References Cited

U.S. PATENT DOCUMENTS

| | | | |
|---|---|---|---|
| 4,760,031 A | 7/1988 | Janesick | |
| 5,688,715 A | 11/1997 | Sexton et al. | |
| 6,169,319 B1 | 1/2001 | Malinovich et al. | |
| 6,489,992 B2 | 12/2002 | Savoye | |
| 6,903,768 B1 | 6/2005 | Ohsawa et al. | |
| 6,960,796 B2 | 11/2005 | Rhodes et al. | |
| 7,005,637 B2 | 2/2006 | Costello et al. | |
| 7,247,829 B2 | 7/2007 | Oda | |
| 8,129,809 B2 * | 3/2012 | Jang | 257/436 |
| 2001/0052574 A1 | 12/2001 | Kurosawa et al. | |
| 2003/0146987 A1 | 8/2003 | Prentice et al. | |
| 2004/0169248 A1 | 9/2004 | Costello et al. | |
| 2005/0243194 A1 | 11/2005 | Xu | |

(Continued)

FOREIGN PATENT DOCUMENTS

EP 1612863 A2 1/2006

(Continued)

OTHER PUBLICATIONS

Janesick, J. "Charge coupled CMOS and hybrid detector arrays," SPIE, San Diego, Focal Plane Arrays for Space Telescope, paper #5167-1, Aug. 2003.

*Primary Examiner* — Hung Lam
(74) *Attorney, Agent, or Firm* — Blakely Sokoloff Taylor & Zafman LLP (57) ABSTRACT

An imaging system capable of black level calibration includes an imaging pixel array, at least one black reference pixel, and peripheral circuitry. The imaging pixel array includes a plurality of active pixels each coupled to capture image data. The black reference pixel is coupled to generate a black reference signal for calibrating the image data. Light transmitting layers are disposed on a first side of a pixel array die including the imaging system and cover at least the imaging pixel array and the black reference pixel. A light shielding layer is disposed on the first side of the pixel array die and covers a portion of the light transmitting layers and the black reference pixel without covering the imaging pixel array.

15 Claims, 9 Drawing Sheets

U.S. PATENT DOCUMENTS

| | | |
|---|---|---|
| 2006/0076590 A1 | 4/2006 | Pain et al. |
| 2007/0001252 A1 | 1/2007 | Noda et al. |
| 2007/0259463 A1 | 11/2007 | Abedini |
| 2008/0001192 A1 | 1/2008 | Inoue et al. |
| 2008/0150057 A1* | 6/2008 | Lee et al. ................ 257/432 |
| 2008/0197268 A1 | 8/2008 | Kameda |
| 2008/0283726 A1 | 11/2008 | Uya et al. |
| 2009/0201393 A1 | 8/2009 | Tai et al. |
| 2010/0110271 A1* | 5/2010 | Yanagita et al. ........... 348/340 |
| 2010/0214457 A1* | 8/2010 | Sakai ........................ 348/294 |
| 2011/0207250 A1* | 8/2011 | Uya ............................ 438/24 |

FOREIGN PATENT DOCUMENTS

| | | |
|---|---|---|
| EP | 1058313 A2 | 12/2006 |
| EP | 1858082 | 11/2007 |
| JP | 3240379 A | 10/1991 |

* cited by examiner

IMAGE SENSOR WITH IMPROVED BLACK LEVEL CALIBRATION

TECHNICAL FIELD

This disclosure relates generally to image sensors, and in particular but not exclusively, relates to black level calibration for CMOS image sensors.

BACKGROUND INFORMATION

Complementary metal-oxide-semiconductor ("CMOS") image sensors ("CIS") may generate inaccurate image data due to dark current in the pixels themselves and variation in the level of dark current from pixel to pixel. Each pixel of a CIS array provides an output voltage that varies as a function of the light incident on the pixel. Unfortunately, dark currents add to the output voltages and degrade the picture provided by the imaging system. To generate accurate image data, it is desirable to estimate dark current and level correct for it.

Modern CMOS imagers often include some sort of feedback loop to automatically set the black level in the output. The analog voltage associated with "true" black may be obtained by reading "black reference pixels." Black reference pixels are typically arrayed immediately next to the active image array. In front side illuminated ("FSI") image sensors, one of the metal layers within the front side metal stack shields the black reference pixels in order to block any incoming light. Circuitry within the FSI image sensor then offsets the voltage output for the active pixels with reference to the output value from these black reference pixels. The black reference pixels are used to generate a low count value or a user specified set point value that will typically be displayed as black. Cameras are traditionally set to a black level set point that is slightly greater than the read noise. Camera gain is then set to achieve a suitable image. Setting the proper black level is particularly important when working at very low signal levels or low ambient light environments. If the black level is set too low, dim objects will be clipped and not displayed. If the black level is set too high, image contrast will suffer.

Figure 1A:
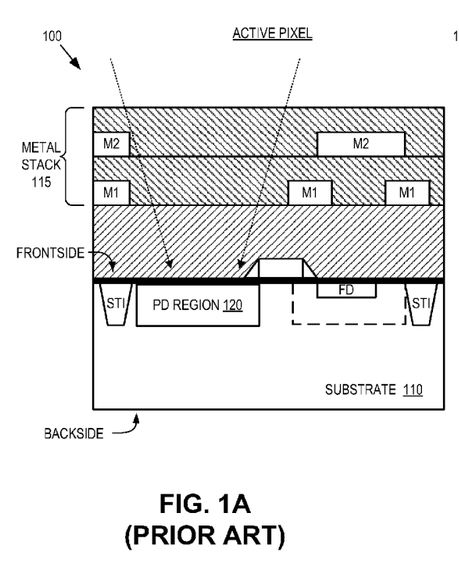
FIG. 1A (PRIOR ART) is a cross-sectional view of a conventional frontside illuminated ("FSI") active pixel.
Figure 1B:
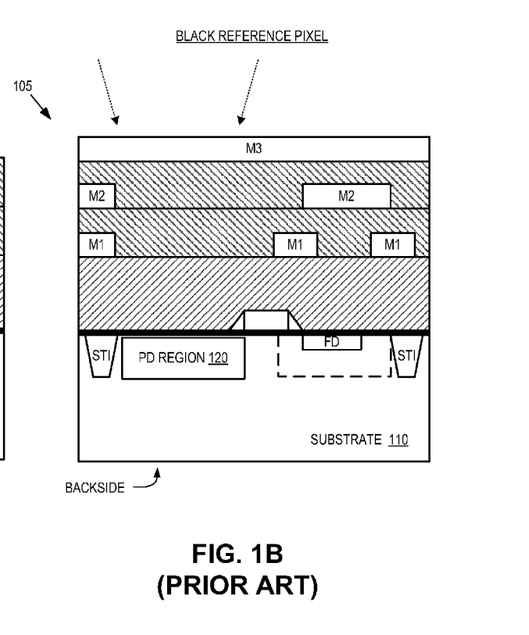
FIG. 1B (PRIOR ART) is a cross-sectional view of a conventional FSI black reference pixel.

FIG. 1A illustrates a conventional active pixel 100 of a FSI image sensor array, while FIG. 1B illustrates a conventional black reference pixel 105 of a FSI image sensor array. The frontside of pixels 100 or 105 is the side of substrate 110 upon which the pixel circuitry is disposed and over which metal stack 115 for redistributing signals is formed. In active pixel 100, the metal layers (e.g., metal layer M1 and M2) are patterned in such a manner as to create an optical passage through which light incident on the frontside of active pixel 100 can reach the photosensitive photodiode ("PD") region 120. In contrast, the optical passage of black reference pixel 105 is intentionally blocked and covered over with a metal layer M3.

CMOS FSI imagers utilize dark pixels, ones with light blocking layers, to estimate the dark current for a pixel array and combine the estimate with the exposed pixel data to generate accurate image data. For backside illuminated ("BSI") CIS it is more difficult and expensive to fabricate light blocking pixels. In addition to added expense, forming a metal pattern on the backside of such an imager can cause etch damage and result in defects. Additionally, insulating films associated with metal light blocking layers may create stress differences between the dark pixels and the imaging pixels that result in the two types of pixels displaying different dark current characteristics. In that case the black level calibration may not faithfully represent the black level of the imaging array.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and method of fabrication for a backside illuminated ("BSI") imaging system with black reference pixels that faithfully produce a black reference level for offsetting active imaging pixels are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics of a given embodiment may be combined in any suitable manner with any of the other embodiments. It is anticipated that the features described below in connection with embodiments one through seven may be combined in a variety of different combinations.

Figure 2:
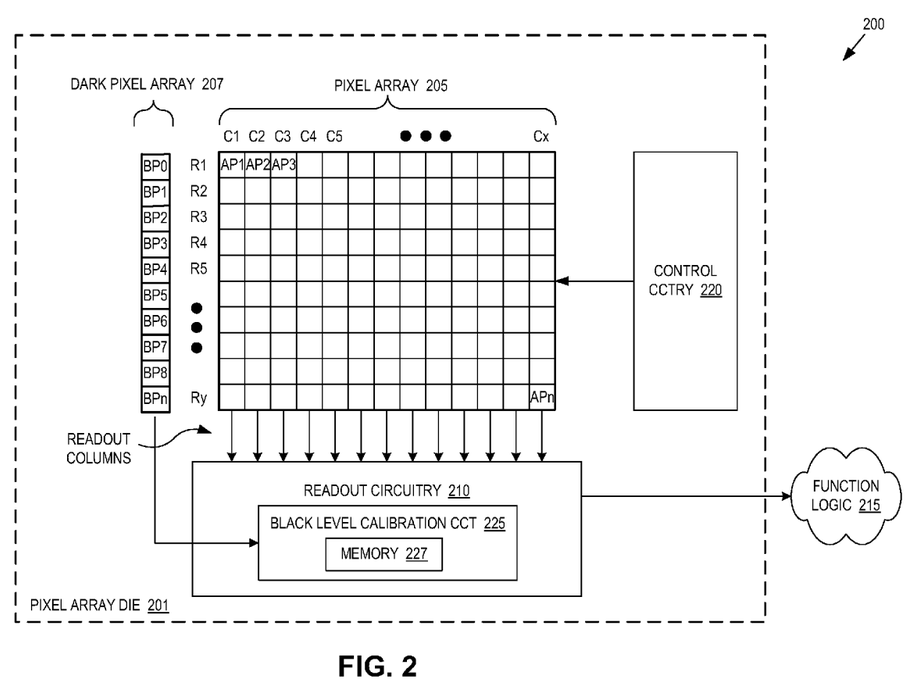
FIG. 2 is a functional block diagram illustrating a backside illuminated ("BSI") imaging system including black reference pixels and black level calibration circuitry, in accordance with an embodiment.

FIG. 2 is a functional block diagram illustrating a BSI imaging system 200, in accordance with an embodiment of the invention. The illustrated embodiment of BSI imaging system 200 includes an imaging pixel array 205, black reference pixel array 207, readout circuitry 210, function logic 215, and control circuitry 220. The illustrated embodiment of readout circuitry 210 includes black level calibration circuitry 225 and memory 227. In the illustrated embodiment, pixel array 205, dark pixel array 207, readout circuitry 210, and control circuitry 220 are all integrated onto a pixel array die 201.

Pixel array 205 is a two-dimensional ("2D") array of BSI imaging sensor pixels (e.g., AP1, AP2 . . . , APn) and black reference pixel array 207 may be a one or two-dimensional array of light shielded pixels (e.g., BP0, BP1 . . . BP9). In one embodiment, each imaging pixel is an active pixel sensor ("APS"), such as a complementary metal-oxide-semiconductor ("CMOS") imaging pixel. In one embodiment, black reference pixels include similar or identical structure to their active pixel counterparts with at least one exception being that they are prevented from receiving light by a light blocking layer. It should be appreciated that embodiments of the present invention may also be implemented in charged coupled device ("CCD") imagers.

As illustrated, each active pixel is arranged into a row (e.g., rows R1 to Ry) and a column (e.g., column C1 to Cx) to acquire image data of a person, place, or object, which can then be used to render an image of the person, place, or object. Pixel array 207 includes one or more black reference pixels for outputting black reference signals that may be used to calibrate a black level set point for the active pixels.

Black level calibration circuitry 225 is coupled to receive the black reference signal which ultimately is used to adjust, offset, or otherwise calibrate the black level set point of the imaging sensors (i.e., APS) thereby accounting (for example) for thermal variations in dark current.

Although FIG. 2 illustrates black level calibration circuitry 225 as internal to readout circuitry 210, it should be appreciated that black level calibration circuitry 225 may be integrated into other functional blocks on the same die (e.g., illustrated as pixel array die 201) as pixel array 205. For example, black level calibration circuitry 225 may be implemented as application specific circuitry for executing embedded logic or a general purpose processor executing firmware embedded elsewhere on the die. Alternatively, the functions performed by black level calibration circuitry 225 may be implemented as software logic within function logic 215 and executed off-die. In one embodiment, just the firmware/software logic may be stored off-die and imported into black level calibration circuitry 225 at startup.

In the illustrated embodiment, pixel array 205 includes black reference pixels BP0-BP9 aligned in a single column down the edge of pixel array 205. Pixel arrays 205 and 207 may share common rows. In this case, each black reference pixel may be used to calibrate the active pixels within its row. Accordingly, in one embodiment, each black reference pixel is logically grouped with one or more imaging pixels to calibrate the black level set point of its associated active pixels. Since many of the influences on the black level set point of each active pixel have localized variations, it may be desirable to distribute the black reference pixels to better account for these localized variations. Some of these localized influences may include temperature, parasitic capacitances, structural design differences, lattice structure defects, and the like. Consequently, pixel array 205 may include any number of black reference pixels distributed throughout pixel array 205 in a variety of different patterns (e.g., around the perimeter of the array, in the corners of the array, in one or more columns, in one or more rows, in one or more clusters, in a checkerboard pattern, in an irregular distribution, or otherwise).

During operation each active pixel acquires image data or image charge, which is readout by readout circuitry 210 and transferred to function logic 215. In one embodiment, black level calibration of the image data is performed within readout circuitry 210 prior to outputting the image data off-chip. In an alternative embodiment, the black reference signals are transferred off-chip with the uncorrected image data into system software or off-chip hardware calibration logic. In one of these alternative embodiments, level calibration is performed off-chip using post-image processing in system software with reference to the scaled black reference signals. In yet another alternative embodiment, temperature signals (from temperature sensors disposed on pixel array die 201) and black reference signals are readout along with the image data and post-processing used to both temperature scale the black reference signals and level correct the image data using the black reference signals.

Readout circuitry 210 may include amplification circuitry, analog-to-digital conversion circuitry, or otherwise. In the illustrated embodiment, readout circuitry 210 includes black level calibration circuitry 225 for adjusting or calibrating the black level set point of each active pixel. The black level set point is the signal level output from each active pixel at which the pixel is deemed to have captured a "true" black image. Black level calibration circuitry 225 scales (e.g., offset, linearly scale, nonlinearly scale, or some combination thereof) the voltage output for each of the active pixels with reference to the output value from its corresponding black reference pixel. The black reference pixels generate a low count value or a user specified set point value that will typically be displayed as black. Cameras are traditionally setup to a black level set point that is slightly greater than the read noise. If the black level set point is set too low, dim objects will be clipped and not displayed. If the black level set point is set too high, image contrast will suffer.

In one embodiment, readout circuitry 210 may readout a row of image data at a time along readout column lines (illustrated) or may readout the image data using a variety of other techniques (not illustrated), such as a serial readout or a full parallel readout of all pixels simultaneously. Once read out, function logic 215 may simply store the image data or even manipulate it by applying post image effects (e.g., crop, rotate, remove red eye, adjust brightness, adjust contrast, or otherwise).

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for simultaneously enabling all pixels within pixel array 205 to simultaneously capture their respective image data during a single acquisition window. In an alternative embodiment, the shutter signal is a rolling shutter signal whereby each row, column, or group of pixels is sequentially enabled during consecutive acquisition windows.

Figure 3:
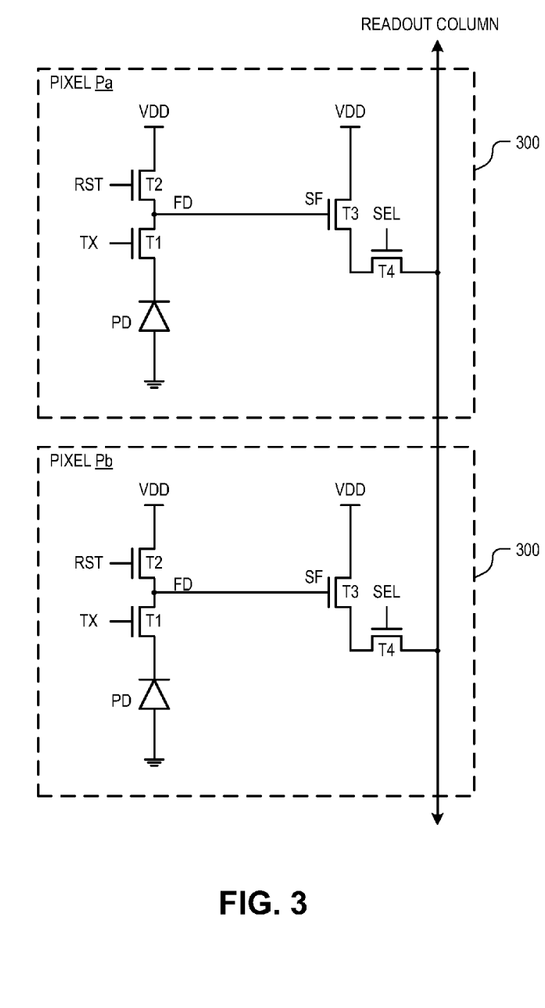
FIG. 3 is a circuit diagram illustrating pixel circuitry of two 4T pixels within a BSI imaging system, in accordance with an embodiment.

FIG. 3 is a circuit diagram illustrating pixel circuitry 300 of two four-transistor ("4T") active pixels within a BSI imaging array, in accordance with an embodiment of the invention. Pixel circuitry 300 is one possible pixel circuitry architecture for implementing each active pixel within pixel array 200 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, various other pixel architectures, and even CCD architectures.

In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 300 to the readout column line under control of a select signal SEL.

Figure 4:
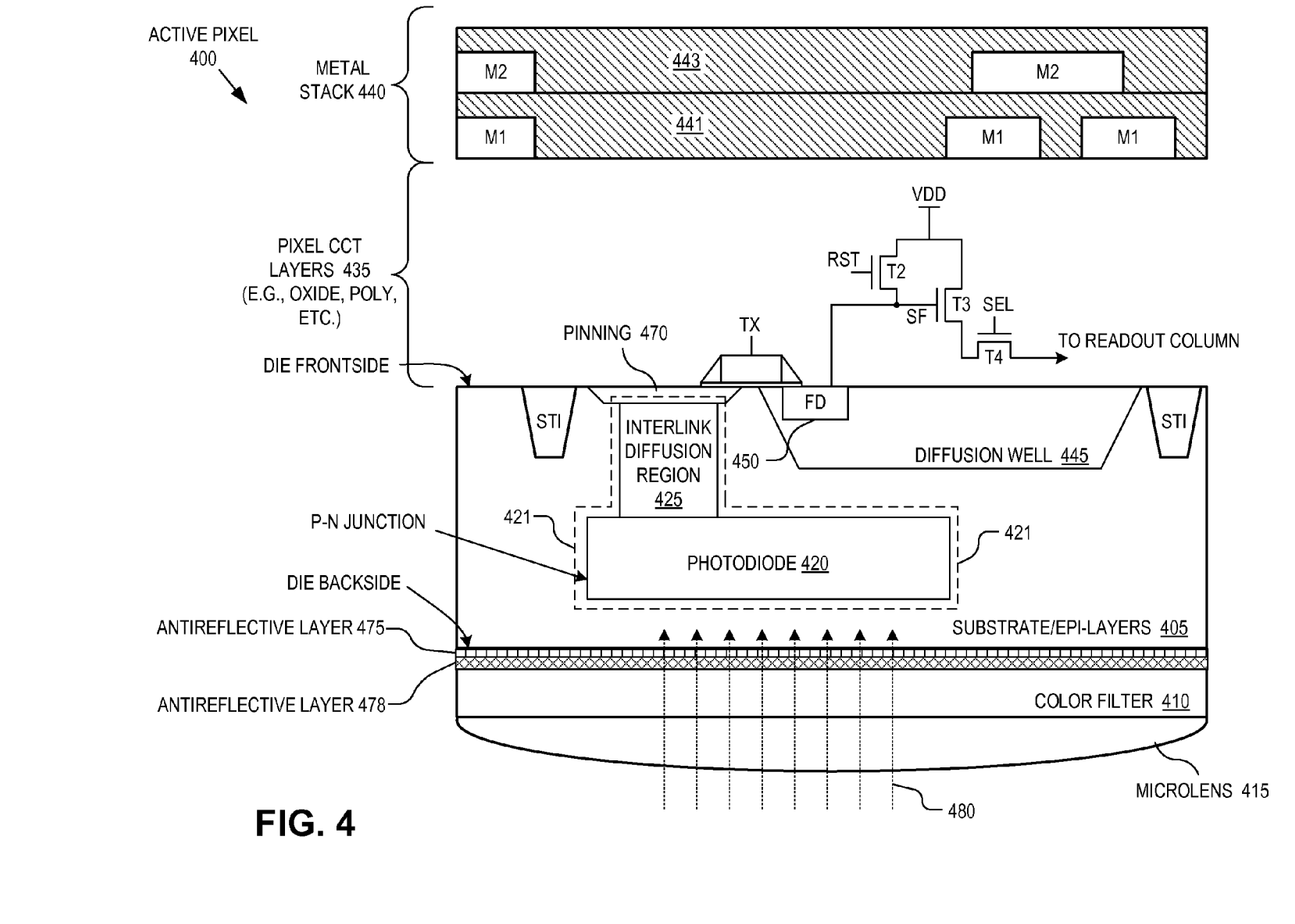
FIG. 4 is a hybrid cross-sectional/circuit illustration of a BSI active imaging pixel, in accordance with an embodiment.

FIG. 4 is a hybrid cross sectional/circuit illustration of a BSI active pixel 400. Active pixel 400 is one possible implementation of active pixels AP1 to APn within pixel array 205. The illustrated embodiment of active pixel 400 includes a substrate 405, antireflective layers 475 and 478, a color filter 410, a microlens 415, a PD region 421 including a doped PD 420 and a doped interlinking diffusion region 425, pixel circuitry layers 435, and a metal stack 440. The illustrated embodiment of pixel circuitry layers 435 include a 4T pixel architecture (other pixel designs may be substituted) disposed over a diffusion well 445. A floating diffusion 450 is disposed within diffusion well 445 and coupled to transfer transistor T1, reset transistor T2, and the gate of SF transistor T3. The illustrated embodiment of metal stack 440 includes two metal layers M1 and M2 separated by inter-metal dielectric layers 441 and 443. Although FIG. 4 illustrates only a two layer metal stack, metal stack 440 may include more or less layers (e.g., three metal layers) for routing signals over the front side of pixel array 205. In one embodiment, a passivation or pinning layer 470 is disposed over interlinking diffusion region 425 and electrically grounded. Finally, shallow trench isolations ("STI") insulate active pixel 400 from adjacent pixels (not illustrated). It should be appreciated that substrate 405 is intended to represent either the combination of remnants of a bulk substrate layer and an epitaxial layer grown thereon or just the epitaxial layer ("epi-layer") if the bulk substrate has been completely removed during fabrication.

As illustrated, active pixel 400 is photosensitive to light 480 incident on the backside of its semiconductor die. Antireflective layers 475 and 478 combine to reduce reflection of light 480 from the die backside. Floating diffusion 450 is doped with an opposite conductivity type dopant as diffusion well 445 to generate a p-n junction within diffusion well 445 and thereby electrically isolating floating diffusion 450. Similarly, photodiode 420 is doped to form a p-n junction with the surrounding epitaxial layer (illustrated as substrate/epi-layers 405) to accumulate image charges in response to light 480. In one embodiment, substrate and/or epi-layers 405 are doped with P-type dopants. In this case, the substrate and/or the epitaxial layers grown thereon may be referred to as a P type substrate 405. In a P type substrate embodiment, diffusion well 445 is a P+ well implant, while PD 420, interlinking diffusion region 425, and floating diffusion 450 are N type doped. In an embodiment where substrate 405 is N type, diffusion well 445 is also N type doped, while PD 420, interlinking diffusion region 425, and floating diffusion 450 have an opposite P type conductivity.

Figure 5:
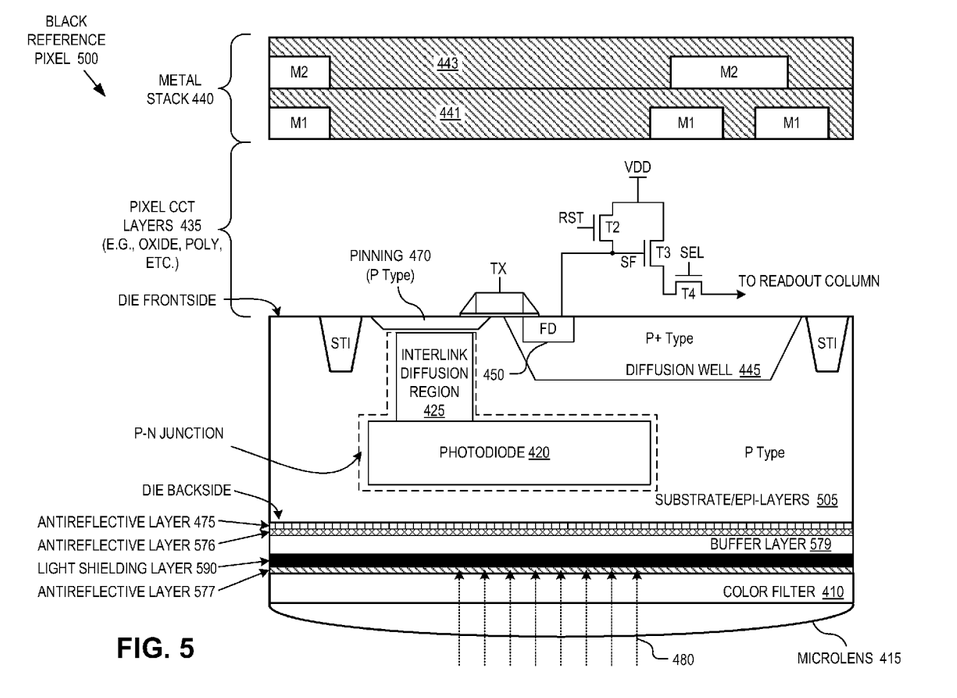
FIG. 5 is a hybrid cross-sectional/circuit illustration of a BSI black reference pixel, in accordance with an embodiment.

FIG. 5 is a hybrid cross-sectional/circuit illustrating a BSI black reference pixel 500. Black reference pixel 500 is one possible implementation of black reference pixels BP1 to BPn within dark pixel array 207. In one embodiment, black reference pixel 500 is similar to active pixel 400 except that it includes a buffer layer 579 and a light shielding layer 590 in the optical path between microlens 415 and PD 420 to block light 480. Antireflective layers 576 and 577 of black reference pixel 500 replace single antireflective layer 478 of active pixel 400 and together perform the same function as layer 478. Light shielding layer 590 is separated from antireflective layer 576 by buffer layer 579. Buffer layer 579 provides an etch stop to prevent damage to antireflective layers 576 and 475, and in some cases even photodiode 420, during plasma etch processing used to form a pattern in light shielding layer 590. In one embodiment, buffer layer 579 is formed of a material that is etch selective relative to its surrounding antireflective layers (e.g., there is an available etchant that will efficiently etch buffer layer 579 but not the adjacent antireflective layer). Buffer layer 579 may be formed of any insulating material, such as an oxide. Light shielding layer 590 may be formed using a variety of optically opaque materials, such as for example, a metal layer.

In the light shielding layer formation process, a photolithographically defined pattern is formed on light shielding layer 590, light shield layer 590 is etched away by a plasma or dry etch, which may partially damage underlying buffer layer 579. Buffer layer 579 is subsequently etched, utilizing the pattern formed in light shielding layer 590 as a mask, with an etchant process that is highly selective to its underlying antireflective layer 576. Conventional plasma or dry etch processes for conventional light shielding layers are not highly selective to conventional antireflective layers and as such antireflective layer 576 may become damaged during the etch of layer 590, if it were not for the presence of buffer layer 579.

Since the pixel circuitry within pixel circuitry layers 435 is retained, black reference pixel 500 generates a baseline or black level reference signal from which the photosensitive active pixel 400 can be calibrated to offset or cancel out the non-optically generated portion of its output signal. Therefore, any signal generated by black reference pixel 500 is the combination of one or more leakage signals, thermally generated signals, or other unwanted signals (e.g., dark currents). By keeping the remaining aspects (e.g., pixel size, pixel circuitry, etc.) of black reference pixel 500 as similar as possible to active pixel 400, these unwanted signal components generated by black reference pixel 500 will closely match or approximate the unwanted signal components generated by active pixel 400. However, it should be appreciated that embodiments of the present invention may still work within acceptable tolerances if other deviations between black reference pixel 500 and active pixel 400 are permitted.

Figure 6:
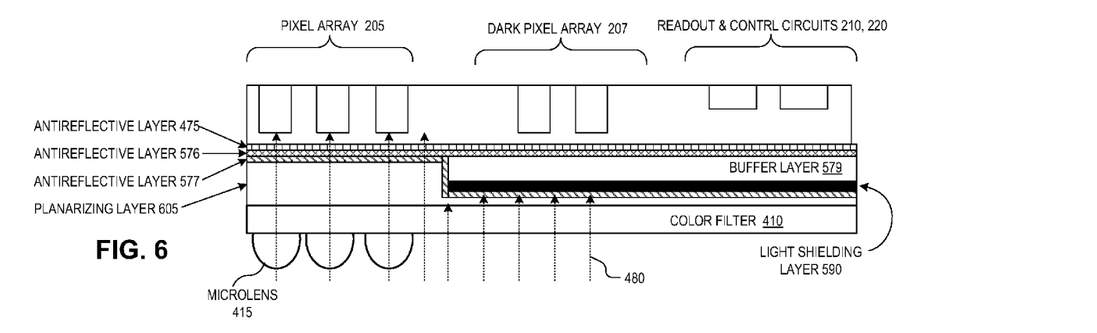
FIG. 6 is a cross-sectional view of a BSI image sensor illustrating an imaging pixel array, a dark pixel array, and peripheral circuitry in relation to a light shielding layer, in accordance with a first embodiment.

FIG. 6 is a cross-sectional view of a BSI image sensor 600 illustrating an imaging pixel array, a dark pixel array, and peripheral circuitry (i.e., circuitry that is peripheral to the imaging pixel array) in relation to a light blocking layer, in accordance with a first embodiment. FIG. 6 shows light shielding layer 590 and buffer layer 579 disposed in the light path to dark pixel array 207 and under the readout and control circuitry 201, 220. FIG. 6 further illustrates how antireflective layers 576 and 577 rejoin in the light path to pixel array 205 to provide the equivalent function of antireflective layer 478 of active pixel 400 as shown in FIG. 4. A planarizing layer 605 is formed in the light path of pixel array 205 in order to provide a planar surface for the formation of color filter 410 and microlenses 415. Planarizing layer 605 compensates for the added thicknesses of layers 590 and 579. In one embodiment, planarizing layer 605 is formed of a polymer material.

It was observed that the dark current measured in dark pixel array 207 was different than that measured in corresponding rows of active pixel array 205. It is speculated that the physical stress imposed upon dark pixel array 207 by the combination of antireflective layers 475, 576 and 577, buffer layer 579, and light shielding layer 590 may be significantly different than the physical stress imposed upon active pixel array 205 by antireflective layers 475, 576, and 577 alone. The physical stresses imposed by these layers may be formed within the layers depending on the various deposition process parameters during fabrication, such as gas pressure and temperature, as well as, due to film thickness, material composition factors, and annealing factors. The remaining embodiments apply various measures to adjust the physical stress difference imposed upon dark pixel array 207 and active pixel array 205 to reduce the dark current difference observed between the dark and active pixels.

Figure 7:
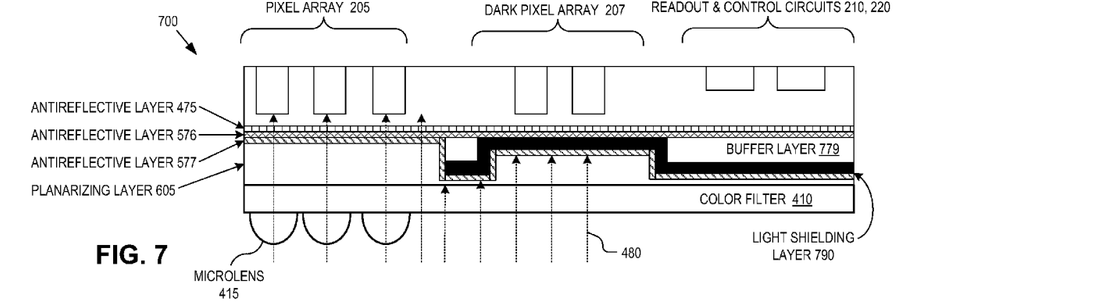
FIG. 7 is a cross-sectional view of a BSI image sensor illustrating an imaging pixel array, a dark pixel array, and peripheral circuitry in relation to a light shielding layer, in accordance with a second embodiment.

FIG. 7 is a cross-sectional view of a BSI image sensor 700 illustrating imaging pixel array 205, dark pixel array 207, and peripheral circuitry (e.g., readout circuitry 210 and control circuit 220) in relation to a light shielding layer 790, in accordance with a second embodiment. FIG. 7 illustrates how buffer layer 779 does not extend under dark pixel array 207, but is retained under the peripheral circuitry and continues to act as an etch stop in the areas where light shielding layer 790 is patterned and removed.

Figure 8:
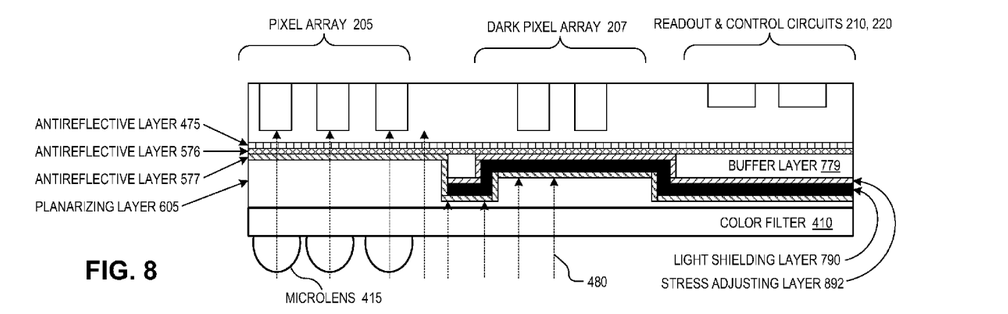
FIG. 8 is a cross-sectional view of a BSI image sensor illustrating an imaging pixel array, a dark pixel array, and peripheral circuitry in relation to a light shielding layer, in accordance with a third embodiment.

FIG. 8 is a cross-sectional view of a BSI image sensor illustrating imaging pixel array 205, dark pixel array 207, and peripheral circuitry in relation to light shielding layer 790, in accordance with a third embodiment. FIG. 8 illustrates how a portion of buffer layer 779 has been removed under dark pixel array 207, but retained elsewhere and continues to act as an etch stop in the areas where light shielding layer 790 is removed. The illustrated embodiment of FIG. 8 further includes a stress adjusting layer 892 disposed above light shielding layer 790 and under buffer layer 779 and antireflective layer 576. Stress adjusting layer 892 is deposited after removal of selected portions of buffer layer 779 and lies above those portions of light shielding layer 790 that remain after its photolithographic patterning. In one embodiment, stress adjusting layer 892 is formed of silicon oxide or silicon nitride. During fabrication, the properties of these layers can be controlled such that the stress imparted by stress adjusting layer 892 counteracts the stresses imposed by the surrounding material layers (e.g., buffer layer 779 and light shielding layer 790). In an alternative embodiment similar to the illustrated embodiment of FIG. 8, stress adjusting layer 892 may replace buffer layer 779 as an etch stop layer. Accordingly, in this alternative embodiment, buffer layer 779 is not present as illustrated in FIG. 8.

Figure 9:
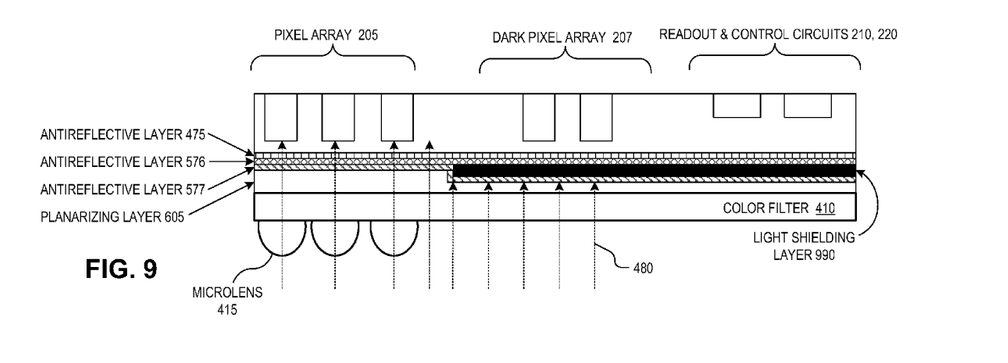
FIG. 9 is a cross-sectional view of a BSI image sensor illustrating an imaging pixel array, a dark pixel array, and peripheral circuitry in relation to a light shielding layer, in accordance with a fourth embodiment.

FIG. 9 is a cross-sectional view of a BSI image sensor illustrating imaging pixel array 205, dark pixel array 207, and peripheral circuitry in relation to a light shielding layer 990, in accordance with a fourth embodiment. FIG. 9 illustrates a BSI image sensor without a buffer layer and therefore any stress differences induced on dark pixel array 207 due to buffer layers 579 or 779 will not be present. In order to complete the photolithographic patterning of light shielding layer 990 without damage to antireflective layer 576, a highly selective etch process, such as a wet chemical etch, is employed, rather than the more typical dry etch or plasma etch processes.

Figure 10A:
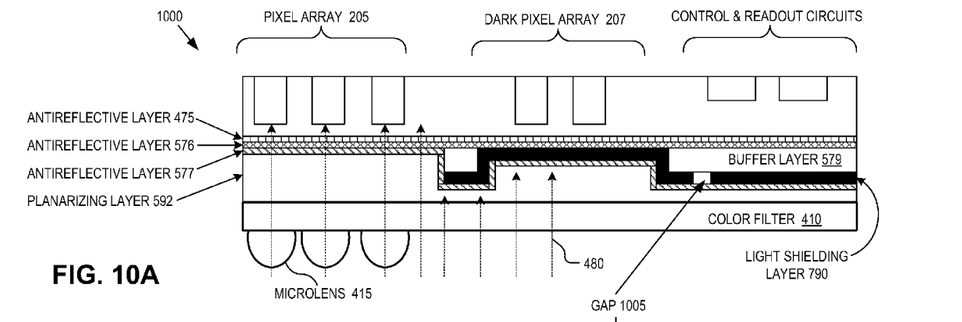
FIG. 10A is a cross-sectional view of a BSI image sensor illustrating an imaging pixel array, a dark pixel array, and peripheral circuitry in relation to a light shielding layer, in accordance with a fifth embodiment.
Figure 10B:
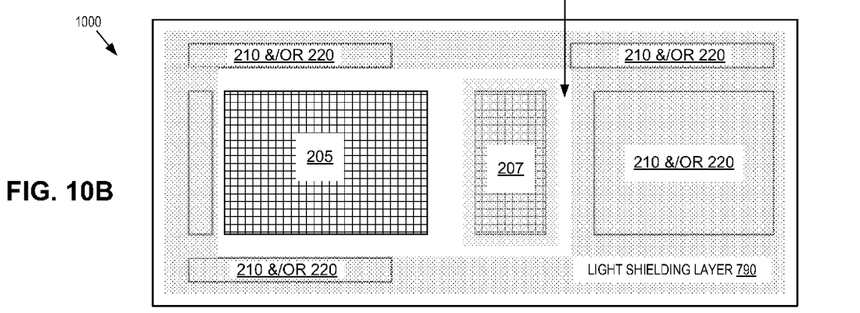
FIG. 10B is a plan view of a BSI image sensor illustrating an imaging pixel array, a dark pixel array, and peripheral circuitry in relation to a light shielding layer, in accordance with the fifth embodiment.

FIGS. 10A and 10B illustrate a BSI image sensor 1000 depicting imaging pixel array 205, dark pixel array 207, and peripheral circuitry in relation to a light shielding layer 790, in accordance with a fifth embodiment. FIG. 10A is a cross-sectional view while FIG. 10B is a plan view of the same. BSI image sensor 1000 is similar to BSI image sensor 700 illustrated in FIG. 7, except that the light shielding layer 790 includes a gap, channel, disconnect, or separation 1005 in light shielding layer 790. In the illustrated embodiment, gap 1005 is photo-lithographically formed in light shielding layer 790 to separate the contiguous portion of light shielding layer 790 under the peripheral circuitry (e.g., readout circuitry 210 and control circuitry 225) from the contiguous portion of light shielding layer 790 under dark pixel array 207. By separating these two portions of light shielding layer 790, stress associated with light shielding layer 790 is reduced under dark pixel array 207. Gap 1005 blocks the stresses on light shielding layer 790 under the peripheral circuitry due to buffer layer 579 from being propagated into light shielding layer 790 under dark pixel array 207.

Figure 11:
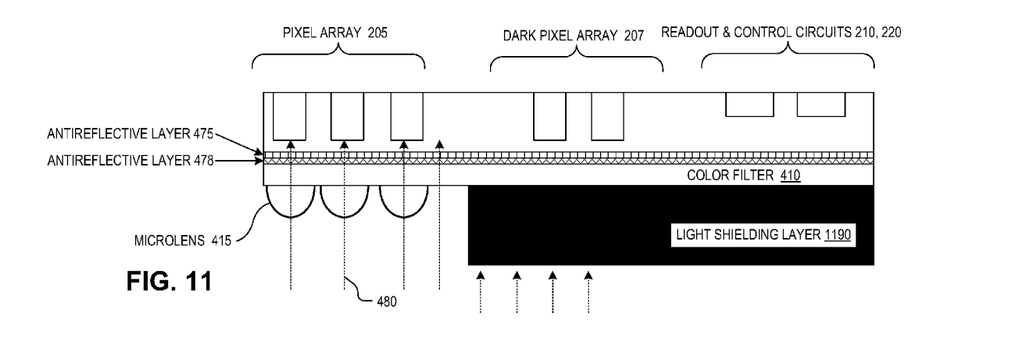
FIG. 11 is a cross-sectional view of a BSI image sensor illustrating an imaging pixel array, a dark pixel array, and peripheral circuitry in relation to a light shielding layer, in accordance with sixth embodiment.

FIG. 11 is a cross-sectional view of a BSI image sensor illustrating imaging pixel array 205, dark pixel array 207, and peripheral circuitry in relation to a light shielding layer 1190, in accordance with a sixth embodiment. The embodiment of FIG. 11 reduces the differences in the overlying layers between imaging pixel array 205 and dark pixel array 207. Light shielding layer 1190 may be a thick organic or inorganic, opaque layer (e.g., polymer) that is photo-lithographically patterned subsequent to forming color filter 410 and microlenses 415. Light shielding layer 1190 may be photosensitive and capable of direct patterning or a separate photoresist pattern may be used in conjunction to form light shielding layer 1190. Light shielding layer 1190 may range between 1 micron and 3 microns thick. Without the addition of a buffer layer (e.g., buffer layers 579 or 779) the stress differences imposed on imaging pixel array 205 and dark pixel array 207 may be reduced.

Figure 12:
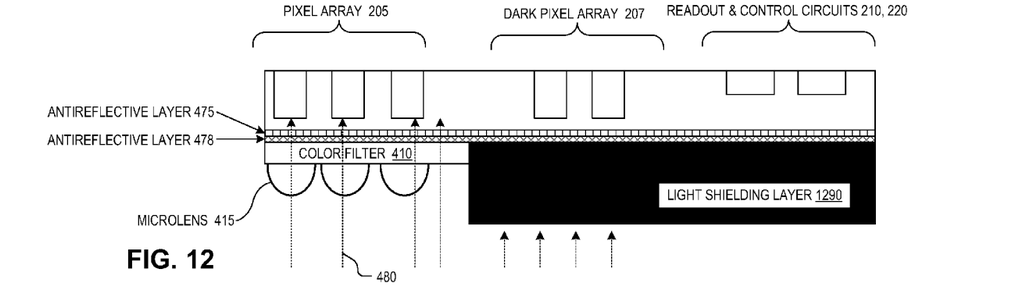
FIG. 12 is a cross-sectional view of a BSI image sensor illustrating an imaging pixel array, a dark pixel array, and peripheral circuitry in relation to a light shielding layer in accordance with a seventh embodiment.

FIG. 12 is a cross-sectional view of a BSI image sensor illustrating imaging pixel array 205, dark pixel array 207, and peripheral circuitry in relation to a light shielding layer 1290, in accordance with seventh embodiment. In the illustrated embodiment of FIG. 12, color filter 410 is absent under light shielding layer 1290 thus reducing the height of light shielding layer 1290 above the back surface of the BSI image sensor. Light shielding layer 1290 may be formed of the same materials as light shielding layer 1190.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An imaging system, comprising:
   an imaging pixel array integrated on a pixel array die, the imaging pixel array including a plurality of active pixels each coupled to capture image data;
   at least one black reference pixel integrated on the pixel array die, the at least one black reference pixel coupled to generate a black reference signal for calibrating the image data;
   peripheral circuitry integrated on the pixel array die, the peripheral circuitry coupled to receive the image data and the black reference signal;
   light transmitting layers disposed on a first side of the pixel array die and covering at least the imaging pixel array and the at least one black reference pixel;
   a light shielding layer disposed on the first side of the pixel array die and covering a portion of the light transmitting layers and the at least one black reference pixel without covering the imaging pixel array; and
   a buffer layer disposed between the light shielding layer and the light transmitting layers, wherein the buffer layer comprises an insulating material that covers at least a portion of the peripheral circuitry but does not cover the at least one black reference pixel or the imaging pixel array.

2. The imaging system of claim 1, wherein the imaging system comprises a complementary metal-oxide-semiconductor ("CMOS") backside illuminated imaging system and wherein the first side comprises a backside of the pixel array die.

3. The imaging system of claim 2, wherein the light transmitting layers comprise first and second antireflective layers and wherein the light shielding layer is disposed directly on one of the first or second antireflective layers and wherein the light shielding layer is patterned and etched using a wet etching process.

4. The imaging system of claim 2, wherein the light shielding layer comprises a metal layer that covers the at least one black reference pixel and at least a portion of the peripheral circuitry.

5. The imaging system of claim 4, wherein the peripheral circuitry includes readout circuitry coupled to readout the imaging data from the imaging pixel array and control circuitry for controlling operation of the imaging pixel array.

6. The imaging system of claim 2, further comprising
   pixel circuitry disposed within the imaging pixel array; and
   a metal stack disposed on a front side of the pixel array die, the metal stack including at least two metal layers for redistributing signals over the imaging pixel array,
   wherein the peripheral circuitry includes black level calibration logic coupled to receive the image data and the black reference signal, the black level calibration logic coupled to level correct the image data based at least in part on the black reference signal.

7. The imaging system of claim 1, wherein the buffer layer comprises a material that is etch selective with respect to an adjacent one of the light transmitting layers.

8. The imaging system of claim 1, further comprising a stress adjusting layer disposed between the light shielding layer and the buffer layer along a first portion of the stress adjusting layer and between the light shielding layer and the light transmitting layers along a second portion of the stress adjusting layer, wherein the stress adjusting layer comprises a material layer having an internal stress that counter acts stresses imposed by at least one of the buffer layer or the light shielding layer.

9. The imaging system of claim 1, wherein the light transmitting layers comprise first and second antireflective layers, the imaging system further comprising a third antireflective layer having a first portion covering the imaging pixel array that contacts the second antireflective layer and a second portion covering the light shielding layer.

10. The imaging system of claim 1, wherein the at least one black reference pixel comprises an array of dark pixels disposed on a portion of the pixel array die adjacent to the imaging pixel array.

11. The imaging system of claim 1, wherein physical stress imposed on the imaging pixel array and the at least one black reference pixel by the light transmitting layers and the light shielding layer are adjusted to reduce dark current mismatches between the imaging pixel array and the at least one black reference pixel.

12. A backside illuminated image sensor, comprising:
    an imaging pixel array including a plurality of active pixels each coupled to capture image data;
    at least one black reference pixel coupled to generate at least one black reference signals for calibrating the image data;
    peripheral circuitry including black level calibration circuitry coupled to receive the image data and the black reference signal and to level correct the image data with the at least one black reference signal;
    antireflection layers disposed on a light receiving side of the backside illuminated image sensor and overlaying the imaging pixel array and the at least one black reference pixel;
    a light shielding layer disposed on a portion of the antireflection layers and overlaying the at least one black reference pixel without covering the imaging pixel array; and
    a buffer layer disposed between the light shielding layer and the antireflective layers, wherein the buffer layer comprises an insulating material that covers at least a portion of the peripheral circuitry but does not cover the at least one black reference pixel or the imaging pixel array.

13. The backside illuminated image sensor of claim 12, wherein the light shielding layer is disposed directly on one of the antireflective layers and wherein the light shielding layer is patterned and etched using a wet etching process.

14. The backside illuminated image sensor of claim 12, further comprising a stress adjusting layer disposed between the light shielding layer and the buffer layer along a first portion of the stress adjusting layer and between the light shielding layer and the antireflective layers along a second portion of the stress adjusting layer, wherein the stress adjusting layer comprises a material layer having an internal stress that counter acts stresses imposed by at least one of the buffer layer or the light shielding layer.

15. An imaging system, comprising:
    an imaging pixel array integrated on a pixel array die, the imaging pixel array including a plurality of active pixels each coupled to capture image data;

at least one black reference pixel integrated on the pixel array die, the at least one black reference pixel coupled to generate a black reference signal for calibrating the image data;

peripheral circuitry integrated on the pixel array die, the peripheral circuitry coupled to receive the image data and the black reference signal;

light transmitting layers disposed on a first side of the pixel array die and covering at least the imaging pixel array and the at least one black reference pixel;

a light shielding layer disposed on the first side of the pixel array die and covering a portion of the light transmitting layers and the at least one black reference pixel without covering the imaging pixel array; and a stress adjusting layer disposed between the light shielding layer and the light transmitting layers, wherein the stress adjusting layer comprises a material layer having an internal stress that counteracts stresses imposed by the light shielding layer to reduce a difference in dark current generated between a first pixel of the imaging pixel array and the at least one black reference pixel, wherein the stress adjusting layer does not cover at least a portion of the imaging pixel array.

* * * * *